US012751123B2

(12) United States Patent
Miao et al.

(10) Patent No.: US 12,751,123 B2
(45) Date of Patent: Sep. 29, 2026

(54) MULTI-CHANNEL VISIBLE LIGHT COMMUNICATION SYSTEM

(71) Applicant: HON HAI PRECISION INDUSTRY CO., LTD., New Taipei City (TW)

(72) Inventors: Wen-Chien Miao, New Taipei City (TW); Yu-Heng Hong, New Taipei City (TW); Fu-He Hsiao, New Taipei City (TW); Yao-Wei Huang, New Taipei City (TW); Hao-Chung Kuo, New Taipei City (TW)

(73) Assignee: HON HAI PRECISION INDUSTRY CO., LTD., New Taipei City (TW)

(*) Notice: Subject to any disclaimer, the term of this patent is extended or adjusted under 35 U.S.C. 154(b) by 366 days.

(21) Appl. No.: 18/537,778

(22) Filed: Dec. 12, 2023

(65) Prior Publication Data

US 2025/0126942 A1 Apr. 17, 2025

(30) Foreign Application Priority Data

Oct. 13, 2023 (TW) ................................ 112139232

(51) Int. Cl.
*H01L 21/78* (2006.01)
*H10H 20/814* (2025.01)
(Continued)

(52) U.S. Cl.
CPC ........ *H10H 20/857* (2025.01); *H10H 20/814* (2025.01); *H10H 20/831* (2025.01); *H10H 20/856* (2025.01)

(58) Field of Classification Search
CPC .. H10H 20/857; H10H 20/814; H10H 20/831; H10H 20/856; H10H 29/856; H10H 29/962
(Continued)

(56) References Cited

U.S. PATENT DOCUMENTS 8,269,229 B2 * 9/2012 Suzuki ................ H01L 25/0756 257/E33.059
9,435,961 B2 * 9/2016 Jiang ...................... G02B 6/124
(Continued)

FOREIGN PATENT DOCUMENTS

CN 111913307 A 11/2020
CN 113189689 A 7/2021
(Continued)

OTHER PUBLICATIONS

Chang-Mo Kang et al., "Hybrid Full-Color Inorganic Light-Emitting Diodes Integrated on a Single Wafer Using Selective Area Growth and Adhesive Bonding", ACS Photonics, 2018, 5, pp. 4413-4422. DOI: 10.1021/acsphotonics.8b00876.
(Continued)

*Primary Examiner* — Vu A Vu
(74) *Attorney, Agent, or Firm* — CKC & Partners Co., LLC

(57) ABSTRACT

A multi-channel visible light communication system includes a carrier board and a plurality of light-emitting device stacks. The light-emitting device stacks are arranged over the carrier board. Each of the light-emitting device stacks includes a first light-emitting device, a second light-emitting device and a first adhesive layer. The second light-emitting device is disposed over the first light-emitting device. The first adhesive layer is disposed between the first light-emitting device and the second light-emitting device. The first adhesive layer includes a first metasurface. The first metasurface is configured to pass a first color light emitted from the first light-emitting device and reflect a second color light emitted from the second light-emitting device.

18 Claims, 4 Drawing Sheets

(51) Int. Cl.

| | |
|---|---|
| ***H10H 20/831*** | (2025.01) |
| ***H10H 20/856*** | (2025.01) |
| ***H10H 20/857*** | (2025.01) |

(58) Field of Classification Search
USPC ............................................................ 257/99
See application file for complete search history.

(56) References Cited

U.S. PATENT DOCUMENTS 9,806,111 B2 10/2017 Kim et al.
10,937,924 B2 * 3/2021 Zou ..................... H01L 25/0753
11,114,499 B2 * 9/2021 Lee ...................... H01L 25/0753
11,282,981 B2 * 3/2022 Kim ..................... H01L 25/0756
11,322,488 B2 * 5/2022 Chang .................... H10H 29/14
11,537,025 B2 12/2022 Ni et al.
11,557,825 B2 * 1/2023 Foo ........................ H01Q 1/243
11,662,081 B2 * 5/2023 Tamma .................. H04N 23/56 359/629
11,901,397 B2 * 2/2024 Jang ................... H10H 20/8506
2009/0145477 A1 * 6/2009 Moon ................... H10F 77/148 136/256
2016/0163940 A1 * 6/2016 Huang ................. H10H 20/857 257/89
2022/0344545 A1 10/2022 Tamma
2024/0397799 A1 * 11/2024 Han ....................... H10K 59/40

FOREIGN PATENT DOCUMENTS

TW 201703280 A 1/2017
TW 202204950 A 2/2022
TW 202205688 A 2/2022

OTHER PUBLICATIONS

Jaeyi Chun et al., "Vertically Stacked Color Tunable Light-Emitting Diodes Fabricated Using Wafer Bonding and Transfer Printing", ACS Applied Materials & Interfaces 2014, 6, pp. 19482-19487. DOI: 10.1021/am505415q.
Jiho Shin et al., "Vertical full-colour micro-LEDs via 2D materials-based layer transfer", Nature, vol. 614, Feb. 2, 2023, pp. 81-87.
H. Jin et al., "Vertically stacked RGB LEDs with optimized distributed Bragg reflectors", Optics Letters, vol. 45, Issue 24, Dec. 15, 2020, pp. 6671-6674.
Wenhong Yang et al., "All-dielectric metasurface for high-performance structural color", Nature Communications, (2020) 11:1864.

* cited by examiner

MULTI-CHANNEL VISIBLE LIGHT COMMUNICATION SYSTEM

CROSS-REFERENCE TO RELATED APPLICATION

This application claims priority to Taiwan Application Serial Number 112139232, filed Oct. 13, 2023, which is herein incorporated by reference in its entirety.

BACKGROUND

Field of Disclosure

Some embodiments of the present disclosure relate to a multi-channel visible light communication system.

Description of Related Art

Visible light communication is one of currently common communication methods, which can avoid the interference of general wireless local area networks (WLAN) or electromagnetic waves transmitted in a high-frequency wireless mode on human bodies and peripheral electronic equipment, and has a high security. Common visible light communication systems may transmit signals by using light-emitting devices (such as light-emitting diodes, microlight-emitting diodes, etc.) as light sources. How to improve the transmission rate and capacity of visible light communication systems is one of research focuses in the art.

SUMMARY

Some embodiments of the present disclosure include a multi-channel visible light communication system including a carrier board and a plurality of light-emitting device stacks. The light-emitting device stacks are arranged over the carrier board, where each of the light-emitting device stacks includes a first light-emitting device, a second light-emitting device and a first adhesive layer. The second light-emitting device is disposed over the first light-emitting device. The first adhesive layer is disposed between the first light-emitting device and the second light-emitting device, where the first adhesive layer includes a first metasurface configured to pass a first color light emitted from the first light-emitting device and reflect a second color light emitted from the second light-emitting device.

In some embodiments, each of the light-emitting device stacks further includes a third light-emitting device and a second adhesive layer. The third light-emitting device is disposed over the second light-emitting device. The second adhesive layer is disposed between the second light-emitting device and the third light-emitting device, where the second adhesive layer includes a second metasurface configured to pass the first color light emitted from the first light-emitting device and the second color light emitted from the second light-emitting device and reflect a third color light emitted from the third light-emitting device.

In some embodiments, the first light-emitting device, the second light-emitting device and the third first light-emitting device of each of the plurality of light-emitting device stacks may be independently controlled.

In some embodiments, the second adhesive layer of each of the plurality of light-emitting device stacks further includes a refractive index matching layer covering the second metasurface.

In some embodiments, the second adhesive layer of each of the plurality of light-emitting device stacks further includes a distributed Bragg reflector below the second metasurface.

In some embodiments, a wavelength of the first color light emitted from the first light-emitting device is greater than that of the second color light emitted from the second light-emitting device, and the wavelength of the second color light emitted from the second light-emitting device is greater than that of the third color light emitted from the third light-emitting device.

In some embodiments, the first light-emitting device is a red light-emitting device, the second light-emitting device is a green light-emitting device, and the third light-emitting device is a blue light-emitting device.

In some embodiments, the first adhesive layer of each of the plurality of light-emitting device stacks further includes a refractive index matching layer covering the first metasurface.

In some embodiments, the refractive index matching layer is made of organic glue.

In some embodiments, the first adhesive layer of each of the plurality of light-emitting device stacks further includes a distributed Bragg reflector below the first metasurface.

Some embodiments of the present disclosure provide a multi-channel visible light communication system including a carrier board and a plurality of light-emitting device stacks. The light-emitting device stacks are arranged over the carrier board, in which each of the plurality of light-emitting device stacks includes a first light-emitting device, a second light-emitting device and a first adhesive layer. The first light-emitting device includes a plurality of first conductive pads. The second light-emitting device is disposed over the first light-emitting device and includes a plurality of second conductive pads, in which the plurality of first conductive pads are electrically isolated from the plurality of second conductive pads. The first adhesive layer is disposed between the first light-emitting device and the second light-emitting device, in which the first adhesive layer includes a first metasurface.

In some embodiments, each of the plurality of light-emitting device stacks further includes a third light-emitting device and a second adhesive layer. The third light-emitting device is disposed over the second light-emitting device and includes a plurality of third conductive pads, in which the plurality of third conductive pads are electrically isolated from the plurality of first conductive pads and the plurality of second conductive pads. The second adhesive layer is disposed between the second light-emitting device and the third light-emitting device, in which the second adhesive layer includes a second metasurface.

In some embodiments, a wavelength of first color light emitted from the first light-emitting device is greater than that of second color light emitted from the second light-emitting device, and the wavelength of the second color light emitted from the second light-emitting device is greater than that of third color light emitted from the third light-emitting device.

In some embodiments, the first light-emitting device is a red light-emitting device, the second light-emitting device is a green light-emitting device, and the third light-emitting device is a blue light-emitting device.

In some embodiments, the first metasurface is configured to pass the first color light emitted from the first light-emitting device and reflect the second color light emitted from the second light-emitting device, and the second metasurface is configured to pass the first color light emitted from the first light-emitting device and the second color light emitted from the second light-emitting device and reflect the third color light emitted from the third light-emitting device.

In some embodiments, the first metasurface of the first adhesive layer includes a first substrate and a plurality of first antennas protruding upward from the first substrate. The second metasurface of the second adhesive layer includes a second substrate and a plurality of second antennas protruding upward from the second substrate.

In some embodiments, the plurality of first antennas differ from the plurality of second antennas in width.

In some embodiments, the plurality of first antennas differ from the plurality of second antennas in arrangement period.

In some embodiments, the first adhesive layer of each of the plurality of light-emitting device stacks further comprises a refractive index matching layer covering upper surfaces and all side faces of the plurality of first antennas of the first metasurface.

In some embodiments, the second adhesive layer of each of the plurality of light-emitting device stacks further comprises a refractive index matching layer covering upper surfaces and all side faces of the plurality of second antennas of the second metasurface.

In summary, some embodiments of the present disclosure provide a multi-channel visible light communication system. The number of channels of the multi-channel visible light communication system can encompass a visible light range to increase the transmission capacity and the transmission speed.

DETAILED DESCRIPTION

Some embodiments of the present disclosure provide a multi-channel visible light communication system. The number of channels of the multi-channel visible light communication system can encompass a visible light range to increase the transmission capacity and the transmission speed. In particular, light-emitting devices in the multi-channel visible light communication system can be stacked vertically, so that more light-emitting devices can be accommodated in the multi-channel visible light communication system; and the light-emitting devices in each light-emitting device stack can be independently controlled to obtain desired color light by mixing, so that color light can encompass a complete visible light range.

Figure 1:
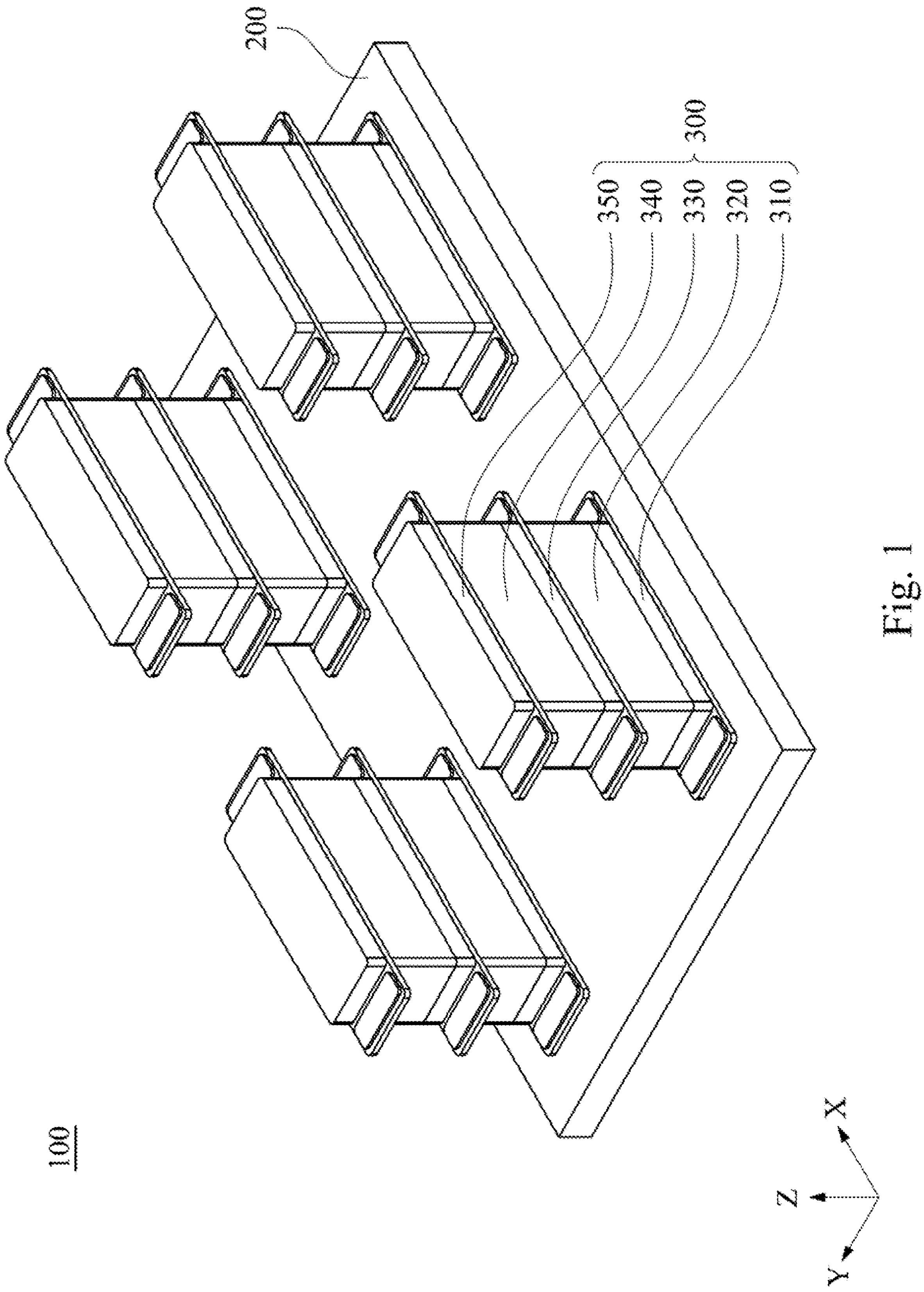
FIG. 1 is a stereogram of a multi-channel visible light communication system according to some embodiments of the present disclosure.

FIG. 1 is a stereogram of a multi-channel visible light communication system 100 according to some embodiments of the present disclosure. The multi-channel visible light communication system 100 includes a carrier board 200 and a plurality of light-emitting device stacks 300.

The carrier board 200 is a carrier board including a drive circuit which can be configured to drive the light-emitting device stacks 300 arranged over the carrier board 200. In some embodiments, the carrier board 200 may be made of a common semiconductor circuit board (silicon (Si), glass, etc.).

The light-emitting device stacks 300 are arranged over the carrier board 200. The light-emitting device stacks 300 can be arranged into an array. For example, the light-emitting device stacks 300 can be arranged in a first direction X and a second direction Y. Each of the light-emitting device stacks 300 includes a first light-emitting device 310, a first adhesive layer 320, a second light-emitting device 330, a second adhesive layer 340 and a third light-emitting device 350 that are stacked vertically. That is, the first light-emitting device 310, the first adhesive layer 320, the second light-emitting device 330, the second adhesive layer 340 and the third light-emitting device 350 of each of the light-emitting device stacks 300 are arranged in a Z direction. Since the first light-emitting device 310, the second light-emitting device 330 and the third light-emitting device 350 in the present disclosure are stacked vertically, the multi-channel visible light communication system 100 can accommodate more light-emitting devices per unit area. It should be noted that while there are only four light-emitting device stacks 300 shown in FIG. 1, more light-emitting device stacks 300 are actually present. In some embodiments, the number of the light-emitting device stacks 300 arranged in the first direction X and the second direction Y can reach several thousands, so the total number of the light-emitting device stacks 300 of the multi-channel visible light communication system 100 can reach several millions.

Figure 2:
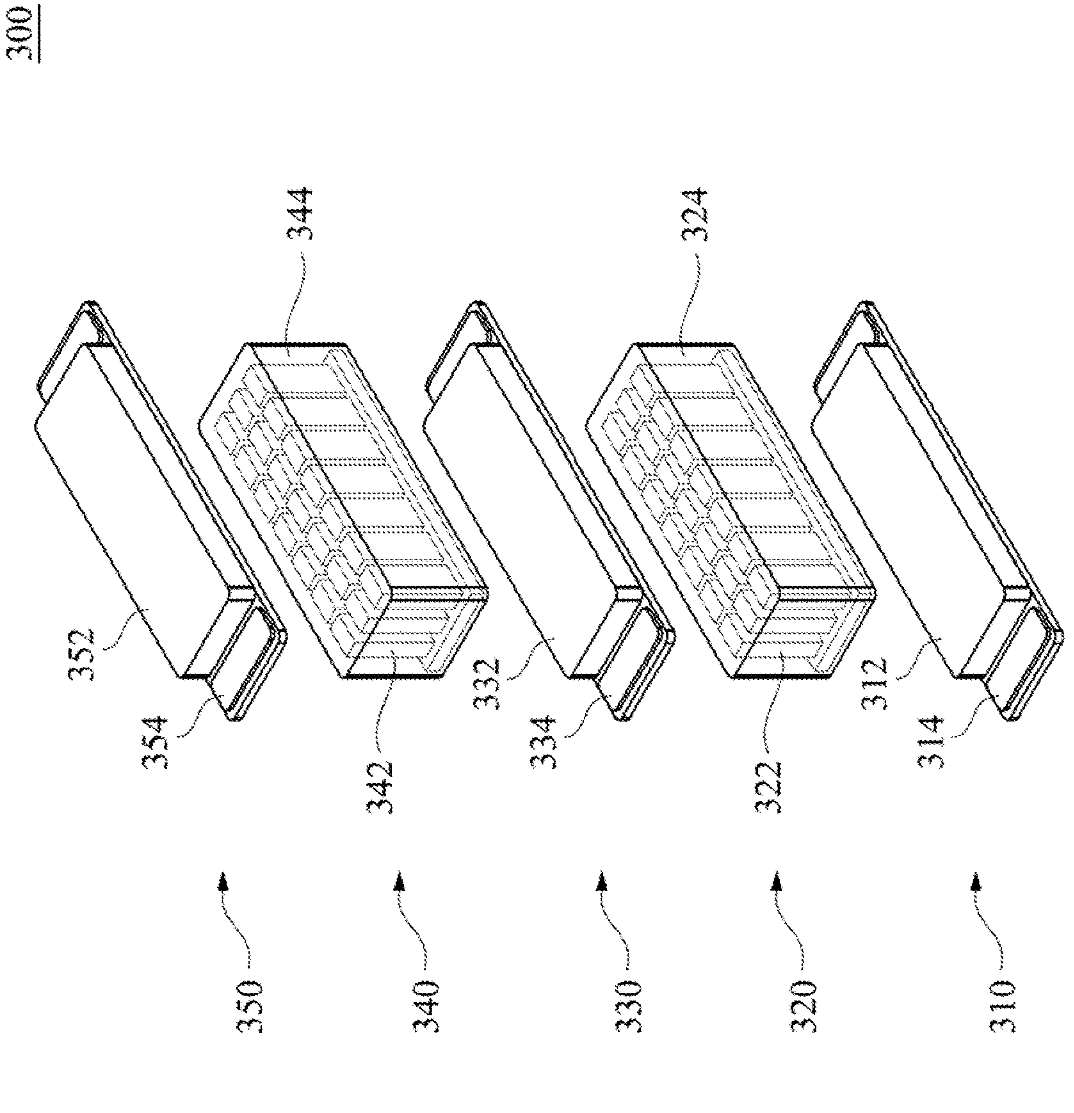
FIG. 2 is an explosive view of a light-emitting device stack in FIG. 1.

FIG. 2 is an explosive view of a light-emitting device stack 300 in FIG. 1. Each of the light-emitting device stacks 300 includes a first light-emitting device 310, a first adhesive layer 320, a second light-emitting device 330, a second adhesive layer 340, and a third light-emitting device 350. The second light-emitting device 330 is disposed over the first light-emitting device 310, and the third light-emitting device 350 is disposed over the second light-emitting device 330. The first adhesive layer 320 is disposed between the first light-emitting device 310 and the second light-emitting device 330 to provide adhesion between the first light-emitting device 310 and the second light-emitting device 330. The second adhesive layer 340 is disposed between the second light-emitting device 330 and the third light-emitting device 350 to provide adhesion between the second light-emitting device 330 and the third light-emitting device 350.

The first light-emitting device 310 includes a chip 312 and conductive pads 314. The chip 312 of the first light-emitting device 310 may be any suitable light-emitting chip, such as a light-emitting diode (LED) chip, a micro-LED chip, an organic LED chip, a semiconductor laser chip, or the like. The chip 312 of the first light-emitting device 310 is configured to emit a first color light. The conductive pads 314 of the first light-emitting device 310 may be located on both sides of the chip 312, and may be configured to electrically connect the first light-emitting device 310 to the carrier board 200 via a wiring (not shown). In particular, one of the conductive pads 314 is connected to the drive circuit in the carrier board 200, and the other of the conductive pads 314 is connected to a ground electrode in the carrier board 200.

The second light-emitting device 330 includes a chip 332 and conductive pads 334. The chip 332 of the second light-emitting device 330 may be any suitable light-emitting chip, such as a light-emitting diode (LED) chip, a micro-LED chip, an organic LED chip, a semiconductor laser chip, or the like. The chip 332 of the second light-emitting device 330 is configured to emit a second color light. The conductive pads 334 of the second light-emitting device 330 may be located on both sides of the chip 332, and may be configured to electrically connect the second light-emitting device 330 to the carrier board 200 via a wiring (not shown). In particular, one of the conductive pads 334 is connected to the drive circuit in the carrier board 200, and the other of the conductive pads 334 is connected to the ground electrode in the carrier board 200.

The third light-emitting device 350 includes a chip 352 and conductive pads 354. The chip 352 of the third light-emitting device 350 may be any suitable light-emitting chip, such as a light-emitting diode (LED) chip, a micro-LED chip, an organic LED chip, a semiconductor laser chip, or the like. The chip 352 of the third light-emitting device 350 is configured to emit a third color light. The conductive pads 354 of the third light-emitting device 350 may be located on both sides of the chip 352, and may be configured to electrically connect the third light-emitting device 350 to the carrier board 200 via a wiring (not shown). In particular, one of the conductive pads 354 is connected to the drive circuit in the carrier board 200, and the other of the conductive pads 354 is connected to the ground electrode in the carrier board 200.

The first light-emitting device 310, the second light-emitting device 330 and the third light-emitting device 350 emit the first color light, the second color light and the third color light respectively. A wavelength of the first color light emitted from the first light-emitting device 310 is greater than that of the second color light emitted from the second light-emitting device 330, and the wavelength of the second color light emitted from the second light-emitting device 330 is greater than that of the third color light emitted from the third light-emitting device 350. That is, the wavelengths of the color lights emitted from the first light-emitting device 310, the second light-emitting device 330 and the third light-emitting device 350 decrease from bottom to top. In some embodiments, the first light-emitting device 310 is a red light-emitting device, the second light-emitting device 330 is a green light-emitting device, and the third light-emitting device 350 is a blue light-emitting device. In some embodiments of the present disclosure, the first light-emitting device 310 directly emits the first color light, the second light-emitting device 330 directly emits the second color light, and the third light-emitting device 350 directly emits the third color light, and the first color light, the second color light and the third color light are respectively different wavebands of color lights. Therefore, the light-emitting device stack 300 does not require an additional wavelength conversion layer to convert the wavelength of the color lights, in such a way, the energy loss of the color lights passing through the wavelength conversion layer can be reduced.

The conductive pads 314 of the first light-emitting device 310, the conductive pads 334 of the second light-emitting device 330 and the conductive pads 354 of the third light-emitting device 350 are independently arranged. That is, there is no electrical connection among the conductive pads 314 of the first light-emitting device 310, the conductive pads 334 of the second light-emitting device 330 and the conductive pads 354 of the third light-emitting device 350. Therefore, the conductive pads 314 of the first light-emitting device 310, the conductive pads 334 of the second light-emitting device 330 and the conductive pads 354 of the third light-emitting device 350 can be independently connected to different drive circuits respectively. In such a way, the first light-emitting device 310, the second light-emitting device 330 and the third light-emitting device 350 can be independently controlled to achieve an "addressable" multi-channel visible light communication system 100. The term "addressable" here refers to that a specific light-emitting device can be specified in the first direction X, the second direction Y and the third direction Z to control the brightness and darkness of the light-emitting device without affecting the control of the other light-emitting devices. Since the first light-emitting device 310, the second light-emitting device 330 and the third light-emitting device 350 of each of the light-emitting device stacks 300 can be independently controlled, a high-degree-of-freedom wavelength adjustment can be achieved, so that the lights emitted from the light-emitting device stacks 300 can be prepared into any color lights by mixing. In particular, the turning on/turning off or intensities of the first color light, the second color light and the third color light can be controlled to cause the composition ratio of the first color light, the second color light and the third color light to be different. When the intensities of the first color light, the second color light and the third color light are different, a function similar to amplitude modulation can be achieved to prepare any color lights by mixing. Different color lights can represent different channels, so the number of channels encompassing all visible light ranges can be designed. Compared with the original number of channels (three channels represented by the first color light, the second color light and the third color light), the transmission capacity and speed of the multi-channel visible light communication system 100 can be greatly increased.

Figure 3:
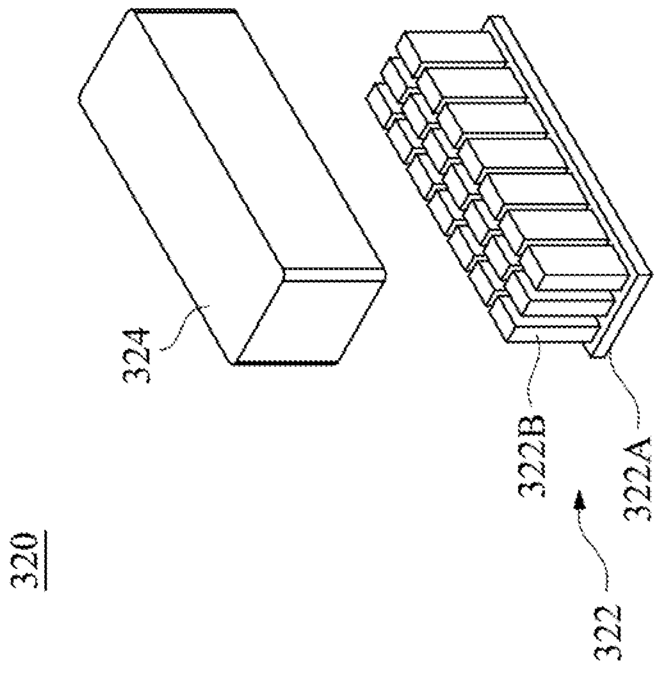
FIG. 3 is an explosive view of a first adhesive layer in FIG. 2 according to some embodiments of the present disclosure.

The first adhesive layer 320 includes a first metasurface 322 and a refractive index matching layer 324. FIG. 3 is an explosive view of the first adhesive layer 320 in FIG. 2 according to some embodiments of the present disclosure. The first metasurface 322 of the first adhesive layer 320 may include a substrate 322A and a plurality of antennas 322B. The antenna 322B are protrusions protruding upward from the substrate 322A. The antennas 322B may be designed to have different widths and arrangement periods to pass the first color light emitted from the first light-emitting device 310 and reflect the second color light emitted from the second light-emitting device 330. The refractive index matching layer 324 covers the first metasurface 322, e.g., covers upper surfaces and all side faces of the antennas 322B. The refractive index matching layer 324 can also fill gaps between the antennas 322B. In some embodiments, the refractive index matching layer 324 may also cover the substrate 322A of the first metasurface 322. The refractive index matching layer 324 may be configured to improve the optical properties between the first light-emitting device 310 and the first adhesive layer 320. For example, if there is no refractive index matching layer 324, the first color light emitted from the first light-emitting device 310 may have an optical property change when entering the first adhesive layer 320 due to the air gap between the first light-emitting device 310 and the first adhesive layer 320. When the first adhesive layer 320 includes the refractive index matching layer 324, the refractive index matching layer 324 can fill the air gap between the first light-emitting device 310 and the first adhesive layer 320 to improve the optical property between the first light-emitting device 310 and the first adhesive layer 320, e.g., to reduce a light loss due to light reflection between the first light-emitting device 310 and the first adhesive layer 320. In some embodiments, the refractive index matching layer 324 can also be used as a protective layer to protect the antennas 322B of the first metasurface 322. In some embodiments, the refractive index matching layer 324 may be made of organic glue.

Figure 4:
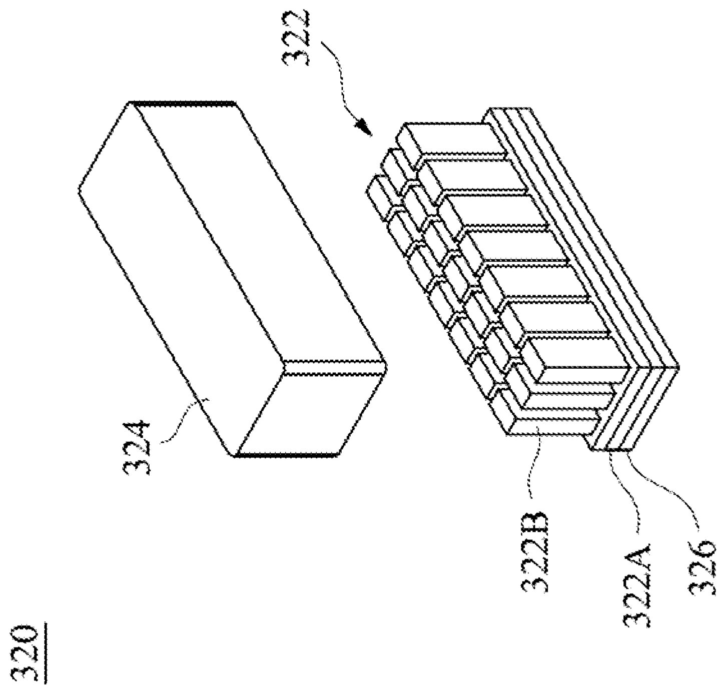
FIG. 4 is an explosive view of a first adhesive layer in FIG. 2 according to other embodiments of the present disclosure.

FIG. 4 is an explosive view of the first adhesive layer 320 in FIG. 2 according to the other embodiments of the present disclosure. The first adhesive layer 320 in FIG. 4 is similar to the first adhesive layer 320 in FIG. 3, except that the first adhesive layer 320 in FIG. 4 further includes a distributed Bragg reflector 326. The distributed Bragg reflector 326 may be disposed below the first metasurface 322, and may also be configured to pass the first color light emitted from the first light-emitting device 310 and reflect the second color light emitted from the second light-emitting device 330. The location of the distributed Bragg reflector 326 is not limited to that shown in FIG. 4, for example, the distributed Bragg reflector 326 may also be located over the first metasurface 322. The distributed Bragg reflector 326 can be formed by alternately stacking high-refractive-index material layers and low-refractive-index material layers. In some embodiments, the refractive index matching layer 324 may also cover the distributed Bragg reflector 326.

The second adhesive layer 340 includes a second metasurface 342 and a refractive index matching layer 344. The second metasurface 342 passes the first color light emitted from the first light-emitting device 310 and the second color light emitted from the second light-emitting device 330 and reflects the third color light emitted from the third light-emitting device 350. The widths and arrangement period of the antennas of the second metasurface 342 can be designed to be different from that of the first metasurface 322 to achieve the above purpose. The other relevant details of the second metasurface 342 and the refractive index matching layer 344 are the same as relevant details of the first metasurface 322 and the refractive index matching layer 324 in FIG. 3, which will not be repeated here. In some embodiments, the second adhesive layer 340 may further include a distributed Bragg reflector, and the location of the distributed Bragg reflector of the second adhesive layer 340 may also be shown in FIG. 4. The distributed Bragg reflector of the second adhesive layer 340 can be configured to pass the first color light emitted from the first light-emitting device 310 and the second color light emitted from the second light-emitting device 330 and reflect the third color light emitted from the third light-emitting device 350.

The first metasurface 322 of the first adhesive layer 320 and the second metasurface 342 of the second adhesive layer 340 can also be configured to adjust the direction of light deflection, so that lights are more directional, and thus can be applied to indoor localization. The first metasurface 322 of the first adhesive layer 320 and the second metasurface 342 of the second adhesive layer 340 may also provide a focusing effect to increase the light intensity. In addition, the first metasurface 322 of the first adhesive layer 320 and the second metasurface 342 of the second adhesive layer 340 can also change the polarization direction of light to expand the application level of visible light communication.

Figure 5A:
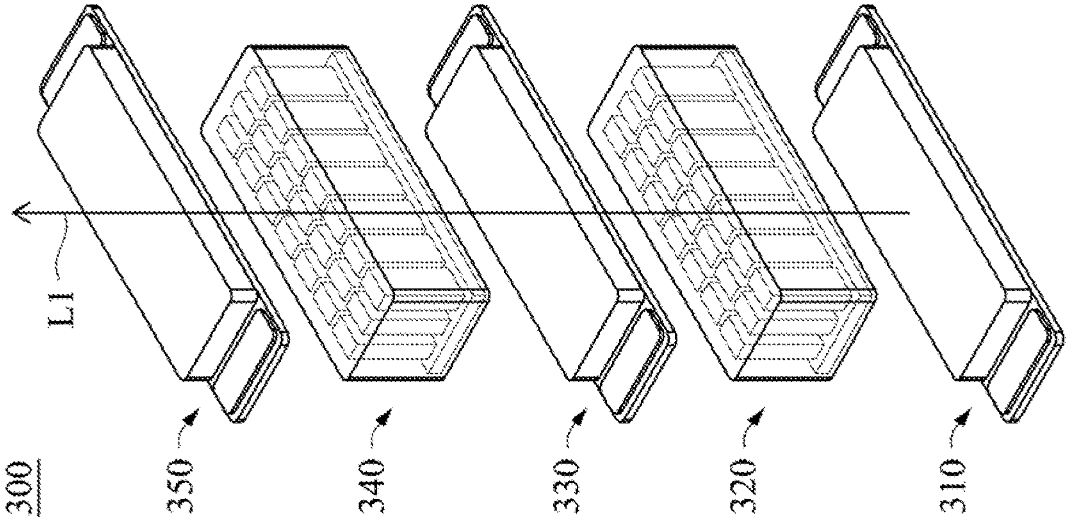
FIG. 5A, FIG. 5B and FIG. 5C are respectively a schematic diagram of use of the first adhesive layer and a second adhesive layer to filter a first color light, a second color light and a third color light according to some embodiments of the present disclosure.
Figure 5B:
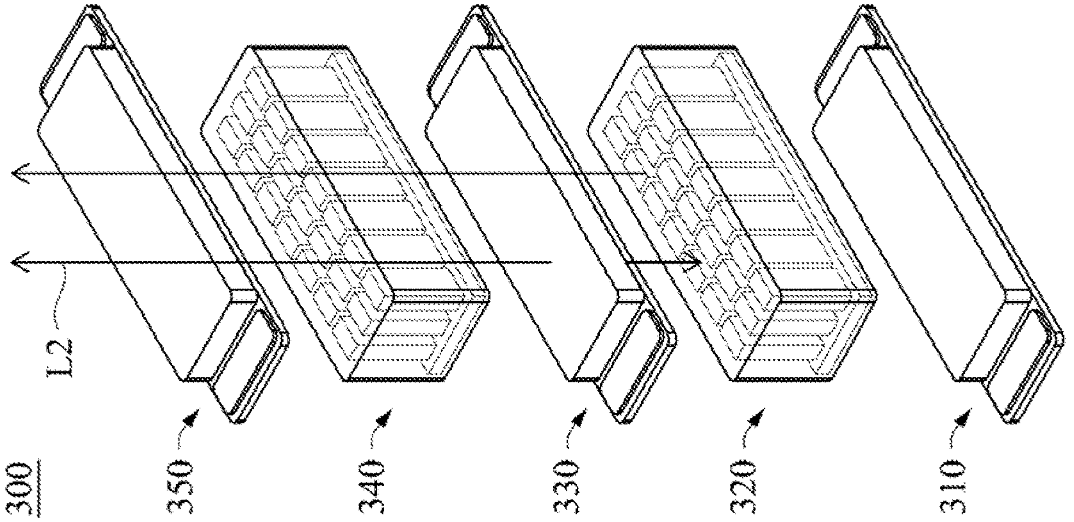
Figure 5C:
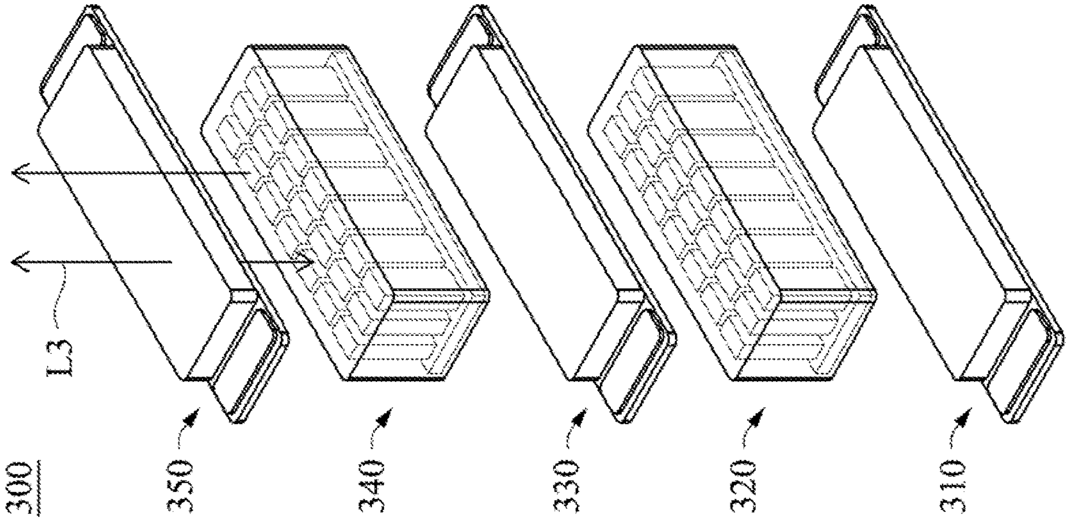

FIG. 5A, FIG. 5B and FIG. 5C are respectively a schematic diagram of use of the first adhesive layer 320 and the second adhesive layer 340 to filter a first color light L1, a second color light L2 and a third color light L3 according to some embodiments of the present disclosure. In FIGS. 5A, 5B and 5C, the first adhesive layer 320 is designed to pass the first color light L1 and reflect the second color light L2. The second adhesive layer 340 is designed to pass the first color light L1 and the second color light L2 and reflect the third color light L3. Therefore, in FIG. 5A, when the first light-emitting device 310 emits the first color light L1, the first color light L1 may be emitted upward by means of passing through the first adhesive layer 320 and the second adhesive layer 340. In FIG. 5B, when the second light-emitting device 330 emits the second color light L2, the second color light L2 may be emitted upward by means of passing through the second adhesive layer 340 or being reflected by the first adhesive layer 320 to pass through the second adhesive layer 340. In FIG. 50, when the third light-emitting device 350 emits the third color light L3, the third color light L3 may be either emitted upward directly, or emitted upward by means of being reflected by the second adhesive layer 340. The wavelengths of the color lights emitted from the first light-emitting device 310, the second light-emitting device 330 and the third light-emitting device 350 decrease from bottom to top. In such a way, the first adhesive layer 320 and the second adhesive layer 340 can prevent a short-wavelength color light emitted from an upper light-emitting device from affecting a lower light-emitting device and then causing a photoluminescence phenomenon (for example, the short-wavelength color light above may enter a quantum dot layer of the lower light-emitting device and cause a photoluminescence phenomenon), thereby avoiding unexpected light emission. In other words, when the wavelengths of the color lights emitted from the first light-emitting device 310, the second light-emitting device 330 and the third light-emitting device 350 increase from bottom to top and the light-emitting device stacks 300 are maintained to emit lights upward, a short-wavelength color light emitted from the lower light-emitting device will affect the upper light-emitting device and cause a photoluminescence phenomenon (for example, a lower short-wavelength color light may enter a quantum dot layer of the upper light-emitting device and cause a photoluminescence phenomenon), thereby resulting in unexpected light emission. Since the first adhesive layer 320 can reflect the second color light L2 emitted from the second light-emitting device 330, and the second adhesive layer 340 can reflect the third color light L3 emitted from the third light-emitting device 350, the first adhesive layer 320 and the second adhesive layer 340 can also recover lights emitted from the back sides of the second light-emitting device 330 and the third light-emitting device 350, thereby increasing a final light intensity. In some embodiments, since a little third color light L3 may still pass through the second adhesive layer 340 to reach the first adhesive layer 320, the first adhesive layer 320 may also be designed to reflect the third color light L3 emitted from the third light-emitting device 350 to avoid the third color light L3 emitted from the third light-emitting device 350 from affecting the first light-emitting device 310 below the first adhesive layer 320.

In such a way, the first color light L1, the second color light L2 and the third color light L3 can be emitted upward and can be mixed to obtain any color lights by independently controlling the first light-emitting device 310, the second light-emitting device 330 and the third light-emitting device 350. In particular, the turning on/turning off or intensities of the first color light, the second color light and the third color light can be controlled to cause the composition ratio of the first color light, the second color light and the third color light to be different. When the intensities of the first color light, the second color light and the third color light are different, a function similar to amplitude modulation can be achieved to prepare any color lights by mixing. Different color lights can represent different channels, so the number of channels encompassing all visible light ranges can be designed. Compared with the original number of channels (three channels represented by the first color light, the second color light and the third color light), the transmission capacity and speed of the multi-channel visible light communication system 100 can be greatly increased.

In some embodiments, the multi-channel visible light communication system 100 can also be used as a display device, so that each of the light-emitting device stacks 300 can be used as a pixel unit. The multi-channel visible light communication system 100 can display images by controlling individual light-emitting device stacks 300 in the multi-channel visible light communication system 100. Since the light-emitting devices in each of the pixel units are stacked vertically, a higher-resolution display device can be achieved.

In summary, some embodiments of the present disclosure provide a multi-channel visible light communication system. The multi-channel visible light communication system includes light-emitting device stacks, so that the multi-channel visible light communication system may accommodate more light-emitting devices. The light-emitting devices in each of the light-emitting device stacks can be independently controlled to prepare any color light by mixing, so that any color light encompasses the number of channels in the visible light range and increases the transmission capacity and the transmission speed. In addition, the light-emitting device stack includes adhesive layers with metasurfaces. The adhesive layers can recover lights emitted from the back sides of the light-emitting devices to increase the light intensity of the multi-channel visible light communication system.

The forgoing embodiments are merely a part rather than all of the embodiments of the present disclosure, and any equivalent variations to the technical solution of the present disclosure made by persons of ordinary skill in the art by reading the specification of the present disclosure shall fall within the claims of the present invention.

What is claimed is:

1. A multi-channel visible light communication system, comprising:
- a carrier board; and
- a plurality of light-emitting device stacks arranged over the carrier board, wherein each of the plurality of light-emitting device stacks comprises:
  - a first light-emitting device;
  - a second light-emitting device, disposed over the first light-emitting device; and
  - a first adhesive layer, disposed between the first light-emitting device and the second light-emitting device, wherein the first adhesive layer comprises a first metasurface configured to pass a first color light emitted from the first light-emitting device and reflect a second color light emitted from the second light-emitting device, the first metasurface of the first adhesive layer comprises:
    - a first substrate; and
    - a plurality of first antennas protruding upward from the first substrate; and
    - a first refractive index matching layer covering upper surfaces and all side faces of the plurality of first antennas of the first metasurface.

2. The multi-channel visible light communication system according to claim 1, wherein each of the plurality of light-emitting device stacks further comprises:
- a third light-emitting device, disposed over the second light-emitting device; and
- a second adhesive layer, disposed between the second light-emitting device and the third light-emitting device, wherein the second adhesive layer comprises a second metasurface configured to pass the first color light emitted from the first light-emitting device and the second color light emitted from the second light-emitting device and reflect a third color light emitted from the third light-emitting device.

3. The multi-channel visible light communication system according to claim 2, wherein the first light-emitting device, the second light-emitting device and the third light-emitting device of each of the plurality of light-emitting device stacks are independently controlled.

4. The multi-channel visible light communication system according to claim 2, wherein the second adhesive layer of each of the plurality of light-emitting device stacks further comprises a second refractive index matching layer covering the second metasurface.

5. The multi-channel visible light communication system according to claim 2, wherein the second adhesive layer of each of the plurality of light-emitting device stacks further comprises a distributed Bragg reflector below the second metasurface.

6. The multi-channel visible light communication system according to claim 2, wherein a wavelength of the first color light emitted from the first light-emitting device is greater than that of the second color light emitted from the second light-emitting device, and the wavelength of the second color light emitted from the second light-emitting device is greater than that of the third color light emitted from the third light-emitting device.

7. The multi-channel visible light communication system according to claim 6, wherein the first light-emitting device is a red light-emitting device, the second light-emitting device is a green light-emitting device, and the third light-emitting device is a blue light-emitting device.

8. The multi-channel visible light communication system according to claim 1, wherein the first refractive index matching layer is made of organic glue.

9. The multi-channel visible light communication system according to claim 1, wherein the first adhesive layer of each of the plurality of light-emitting device stacks further comprises a distributed Bragg reflector below the first metasurface.

10. A multi-channel visible light communication system, comprising:
- a carrier board; and
- a plurality of light-emitting device stacks, arranged over the carrier board, wherein each of the plurality of light-emitting device stacks comprises:
  - a first light-emitting device comprising a plurality of first conductive pads;
  - a second light-emitting device disposed over the first light-emitting device and comprising a plurality of second conductive pads, wherein the plurality of first conductive pads are electrically isolated from the plurality of second conductive pads; and
  - a first adhesive layer, disposed between the first light-emitting device and the second light-emitting device, where the first adhesive layer comprises a first metasurface, the first metasurface of the first adhesive layer comprises:
    - a first substrate; and
    - a plurality of first antennas protruding upward from the first substrate; and a first refractive index matching layer covering upper surfaces and all side faces of the plurality of first antennas of the first metasurface.

11. The multi-channel visible light communication system according to claim 10, wherein each of the plurality of light-emitting device stacks further comprises:

a third light-emitting device disposed over the second light-emitting device and comprising a plurality of third conductive pads, wherein the plurality of third conductive pads are electrically isolated from the plurality of first conductive pads and the plurality of second conductive pads; and a second adhesive layer, disposed between the second light-emitting device and the third light-emitting device, where the second adhesive layer comprises a second metasurface.

12. The multi-channel visible light communication system according to claim 11, wherein a wavelength of first color light emitted from the first light-emitting device is greater than that of second color light emitted from the second light-emitting device, and the wavelength of the second color light emitted from the second light-emitting device is greater than that of third color light emitted from the third light-emitting device.

13. The multi-channel visible light communication system according to claim 12, wherein the first light-emitting device is a red light-emitting device, the second light-emitting device is a green light-emitting device, and the third light-emitting device is a blue light-emitting device.

14. The multi-channel visible light communication system according to claim 12, wherein the first metasurface is configured to pass the first color light emitted from the first light-emitting device and reflect the second color light emitted from the second light-emitting device, and the second metasurface is configured to pass the first color light emitted from the first light-emitting device and the second color light emitted from the second light-emitting device and reflect the third color light emitted from the third light-emitting device.

15. The multi-channel visible light communication system according to claim 11, wherein the second metasurface of the second adhesive layer comprises:

a second substrate; and a plurality of second antennas protruding upward from the second substrate.

16. The multi-channel visible light communication system according to claim 15, wherein the plurality of first antennas differ from the plurality of second antennas in width.

17. The multi-channel visible light communication system according to claim 15, wherein the plurality of first antennas differ from the plurality of second antennas in arrangement period.

18. The multi-channel visible light communication system according to claim 15, wherein the second adhesive layer of each of the plurality of light-emitting device stacks further comprises a second refractive index matching layer covering upper surfaces and all side faces of the plurality of second antennas of the second metasurface.

* * * * *